United States Patent [19]
Talwar et al.

[11] Patent Number: 5,956,603
[45] Date of Patent: Sep. 21, 1999

[54] GAS IMMERSION LASER ANNEALING METHOD SUITABLE FOR USE IN THE FABRICATION OF REDUCED-DIMENSION INTEGRATED CIRCUITS

[75] Inventors: Somit Talwar, Palo Alto; Kurt Weiner, San Jose, both of Calif.

[73] Assignee: Ultratech Stepper, Inc., San Jose, Calif.

[21] Appl. No.: 09/141,842

[22] Filed: Aug. 27, 1998

[51] Int. Cl.$^6$ ................................................. H01L 21/265
[52] U.S. Cl. ........................ 438/520; 438/522; 438/952
[58] Field of Search .................................. 438/166, 474, 438/482, 486, 487, 517, 952

[56] References Cited

U.S. PATENT DOCUMENTS

| | | | |
|---|---|---|---|
| 4,371,421 | 2/1983 | Fan et al. ................................ | 117/45 |
| 4,463,492 | 8/1984 | Maeguchi ............................... | 438/166 |
| 4,659,392 | 4/1987 | Vasudev ................................. | 438/412 |
| 4,753,895 | 6/1988 | Mayer et al. .......................... | 438/154 |
| 5,077,223 | 12/1991 | Mukai ..................................... | 438/522 |
| 5,087,576 | 2/1992 | Edmond et al. ....................... | 438/522 |
| 5,318,915 | 6/1994 | Baliga et al. .......................... | 438/520 |

*Primary Examiner*—John F. Niebling
*Assistant Examiner*—Christopher Lattin
*Attorney, Agent, or Firm*—Allston L. Jones

[57] ABSTRACT

A method for fabricating a plurality of shallow-junction metal oxide semiconductor field-effect transistors (MOSFETs) on a selected area of a silicon wafer, in the case in which the MOSFETs are spaced from one another by substantially transparent isolation elements. The method includes the step of flooding the entire selected area with laser radiation that is intended to effect the heating to a desired threshold temperature of only the selected depth of a surface layer of silicon that has been previously amorphized to this selected depth and then doped. This threshold temperature is sufficient to melt amorphized silicon but is insufficient to melt crystalline silicon. However, should the laser radiation be directly incident on both the substantially transparent isolation elements and the silicon surface, a variable portion of the energy of the incident radiation traveling through the substantially transparent isolation elements would be transferred to the silicon surfaces in contact with the isolation elements depending on the depth of the isolation elements thereby causing unpredictable additional heating of the silicon which would result in an unwanted shift in the fluence required to reach the melt threshold temperature in those silicon regions which reach the melt threshold temperature. To prevent this, a top layer stack of a dielectric and a highly radiation-absorbent material (e.g., silicon dioxide and tantalum nitride) is deposited over the selected area prior to the flooding of the entire selected area with laser radiation taking place. After, the melted silicon has cooled and recrystallized, the top layer of highly radiation-absorbent material is stripped.

15 Claims, 5 Drawing Sheets

GAS IMMERSION LASER ANNEALING METHOD SUITABLE FOR USE IN THE FABRICATION OF REDUCED-DIMENSION INTEGRATED CIRCUITS

BACKGROUND OF THE INVENTION

1. Field of the Invention

This invention relates to the fabrication of integrated circuits (IC) and, more particularly, to the fabrication of IC comprising metal oxide semiconductor field-effect transistors (MOSFET) employing shallow junction formation.

2. Description of the Prior Art

Incorporated by reference herein is U.S. patent application Ser. No. 08/792,107, filed Jan. 31, 1997 and assigned to the assignee of the present application. The present invention and the aforesaid patent application are concerned with alternative solutions to a problem which arises in the fabrication of MOSFETs (e.g., CMOS field-effect transistors), having gate length dimensions that are scaled down from 0.25 $\mu$m to only 0.18 $\mu$m. For the 0.18 $\mu$m CMOS technology, these junctions depths are projected, by the Semiconductor Industry Association's "The National Technical Roadmap for Semiconductors" (1995), to be less than 80 nm.

The first step of each of these alternative solutions is to amorphize a selected surface layer of crystalline silicon of each MOSFET to a selected depth. However, the remaining steps of each of these alternative solutions are different from one another.

In the case of the solution disclosed in the aforesaid patent application, a selected amount of doping material is deposited as a film on the surface of the amorphized selected surface layer of the silicon and then at least a portion of the amorphized selected surface layer of the silicon is temporarily heated, using prior-art projection gas immersion laser doping (P-GILD), for a certain time to a temperature which is sufficient to melt amorphized silicon but is insufficient to melt crystalline silicon (since the melting temperature of amorphized silicon is substantially below that of crystalline silicon). P-GILD is a relatively new technique, known in the art, for doping silicon that eliminates up to 11 steps in the current process and can produce very shallow, sharply-defined regions of doping covering a wide range of doping concentrations. A revolutionary approach to impurity incorporation at precise locations in the silicon, P-GILD eliminates the need to build a mask on the wafer in order to define the regions to be doped prior to implantation. In accordance with the teaching of the aforesaid patent application, doping depth (and, hence, the depth of the junctions being formed in the selected surface layer) is determined solely by the depth of the melted amorphized selected surface layer. After the completion of the certain heating time, the melted silicon of the heated portion is permitted to cool, thereby effecting a recrystallization of the silicon of this portion of the selected surface layer. Finally, the recrystallized silicon of this portion of the selected surface layer may be annealed.

As known, amorphization implants produce supersaturation of point defects. Upon annealing, point defect injection results in nucleation of extended defects. A critical annealing temperature applied for a selected time (e.g., 1050° C. for 10 sec.) by means of conventional rapid thermal processes is ordinarily required to anneal out the extended defects. However, the laser melting of the amorphized silicon by the P-GILD doping operation inherently provides a certain amount of annealing. Further, due to the small number of point defects present after the laser process, the junctions are not likely to move much as a result of this thermal cycle. Therefore, as speculated in the aforesaid patent application, no additional anneal for laser annealed junctions may be necessary. However, as further speculated in the aforesaid patent application, the exact extent of the diffusion after laser annealing needs to be determined experimentally in order to determine if any additional annealing is necessary.

The solution provided by the present invention employs prior-art ion implantation of dopants in at least a portion of the selected amorphized surface layer of the silicon and then the surface layer of the silicon is temporarily heated, using laser thermal annealing (LTA), for a certain time to a temperature which is sufficient to melt amorphized silicon but is insufficient to melt crystalline silicon (since the melting temperature of amorphized silicon is substantially below that of crystalline silicon). After the completion of the certain heating time, the melted silicon of the heated portion is permitted to cool, thereby effecting a recrystallization of the silicon of this portion of the selected surface layer.

Although the LTA process is similar in certain respects to the P-GILD process, the LTA process is materially different in other respects from the P-GILD process. In both processes, a selected area of a silicon wafer is immersed in a gas and high-power projected laser radiation is used to heat the immersed gas and those particular regions of the wafer surface that are then being illuminated by the radiation. However, the immersion gas employed in the P-GILD process is an active gas which includes vaporized dopants, while the immersion gas employed in the LTA process is a relatively inert gas, such as nitrogen. Further, in the P-GILD process, the resolution capability of the projection optics must be high enough to accurately image a group of spaced reticle patterns on a corresponding group of sharply-defined spaced regions of doping of the silicon wafer. In the LTA process, however, the resolution capability of the projection optics (which need be only sufficient to flood the entire selected area of the silicon wafer with the illuminating radiation) is significantly lower than the high resolution capability of the projection optics needed by the P-GILD process. Therefore, it is plain that projection optics suitable for use with the LTA process is simpler and less costly than projection optics suitable for use with the P-GILD process. However, for the LTA process to be manufacturable in the fabrication of MOSFETs employing shallow junction formation, the process margins must be large enough to account for laser illumination energy fluctuations. This condition can be met with the correct choice of lasers and proper spatial homogenization of the laser illumination.

Nevertheless, problems arise in the fabrication of MOSFETs employing shallow junctions when the LTA process is applied directly to the silicon wafer surface at the point in the fabrication process that follows the implantation of dopants in the amorphized silicon layer. These problems are due to the fact that the silicon wafer surface is not a uniform absorber of the incident radiation. This non-uniformity results in geometry effects over the radiation-flooded selected area that cause fluctuations and shifts in the melt threshold of the shallow-junction MOSFETs being fabricated. Such melt threshold shifts introduce too much variability for the LTA process, as known, to be viable.

The present invention addresses this melt-threshold-shift shortcoming, thereby making the LTA process manufacturable in the fabrication of a plurality of shallow-junction MOSFETs, which MOSFETs are spaced from one another by substantially transparent isolation elements.

SUMMARY OF THE INVENTION

Disclosed is an improvement in a method for fabricating, on a selected area of a surface layer of a substrate, at least certain portions of source and drain junctions of a plurality of spaced MOSFETs. The selected area includes an isolation element composed of a first selected material that is substantially transparent to selected-wavelength laser radiation disposed between the crystalline silicon material of adjacent ones of the plurality of MOSFETs being fabricated. One step in the aforesaid method comprises amorphizing a surface layer of the crystalline silicon material of the plurality of MOSFETs being fabricated to a selected depth. The improvement in the aforesaid method further comprises the following steps:

ion implanting a selected dosage of dopants of the appropriate type in the silicon surface layer of the plurality of n-channel or p-channel MOSFETs being fabricated either before or after the amorphizing step;

depositing at least a layer of a second selected material of a first selected thickness over the entire selected area of the surface layer of the substrate, the layer of the second selected material (1) being absorbent of selected-wavelength laser radiation incident thereon (2) having a melting temperature higher than that of crystalline silicon, and (3) having a surface that is situated in an exposed position with respect to incident selected-wavelength laser; and then flooding the entire selected area of the surface of the layer of the second selected material with a selected value of substantially uniform energy laser radiation of the selected wavelength, the selected value being such as to result in the silicon underlying the selected area being heated to a temperature which is sufficient to melt amorphized silicon but insufficient to melt crystalline silicon.

Upon cooling, the melted silicon recrystallizes, thereby ensuring that the depth of the certain portions of the source and drain junctions of the plurality of spaced MOSFETs is determined solely by the selected depth of the amorphized surface layer.

DESCRIPTION OF THE PREFERRED EMBODIMENT

Figure 1:
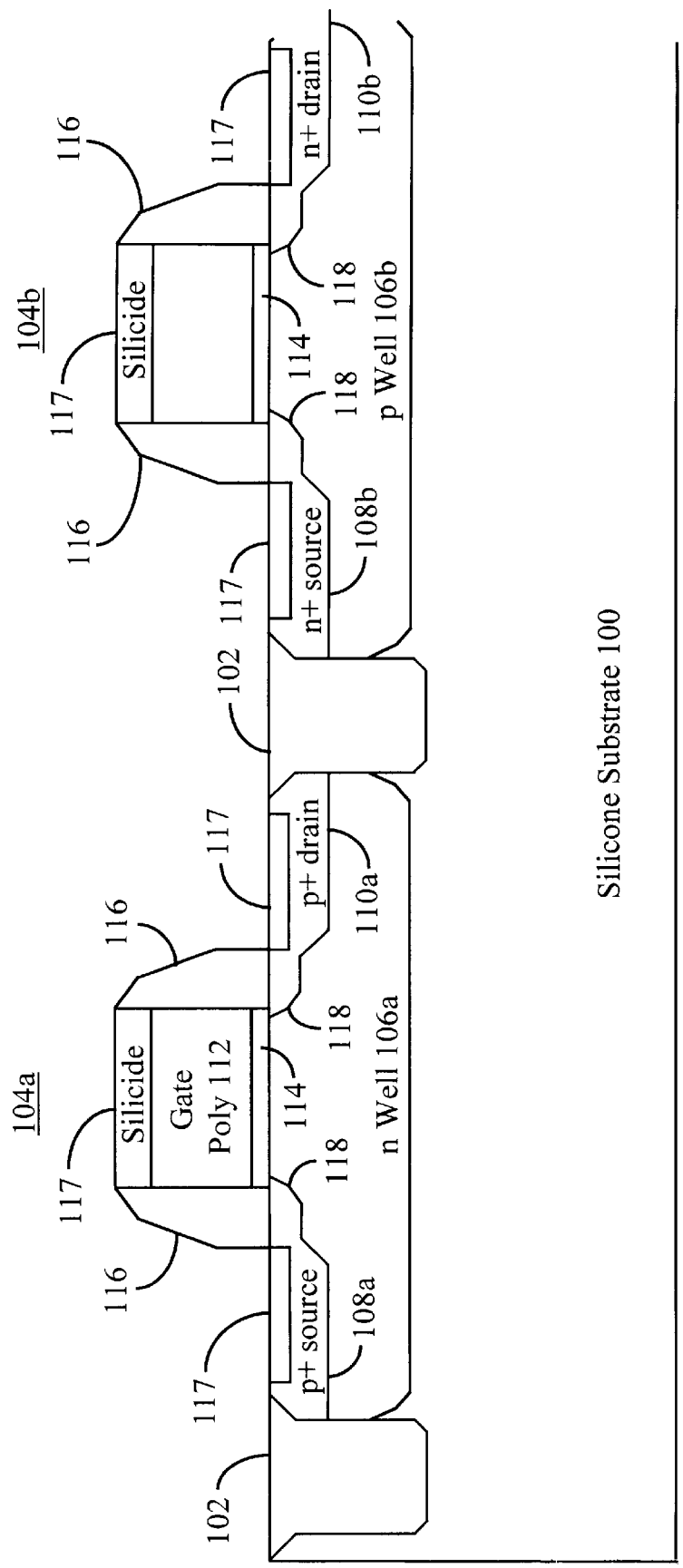
FIG. 1 (which is identical to FIG. 1 of the aforesaid patent application) diagrammatically shows the structure of an n-channel and a p-channel FET that have been fabricated in accordance with modem silicon CMOS technology.

Referring to FIG. 1, there is shown 2 complimentary CMOS structures comprising silicon substrate 100, isolation elements 102 (composed of $SiO_2$) and complimentary FETs 104a and 104b. The structure of complimentary FETs 104a and 104b differ only in that FET 104a comprises n well 106a, $p^+$ source 108a and $p^+$ drain 110a, while FET 104b comprises p well 106b, $n^+$ source 108b and $n^+$ drain 110b. In all other respects, the structure of complimentary MOSFETs 104a and 104b is similar. Specifically, both complimentary MOSFETs 104a and 104b comprise (1) gate poly 112 insulated from the well of that MOSFET by a thin layer 114 of $SiO_2$, (2) side wall spacers 116 supporting the gate poly 112 of each of MOSFETs 104a and 104b, (3) silicide electrical contacts 117 situated on top of the respective gate poly, source and drain of each of complimentary MOSFETs 104a and 104b, and (4) lightly doped extensions 118 coupling the source and drain of each of complimentary MOSFETs 104a and 104b to the channel region under the gate poly.

It is apparent from FIG. 1 that the shallowest junctions are the lightly doped extensions 118, which connect the deep sources and drains to the gate poly channel. Extensions 118 are needed to prevent drain induced barrier lowering (DIBL) and punchthrough.

The earliest steps of both the method disclosed in the aforesaid patent application and the method of the present invention for fabricating the complimentary MOSFETs 104a and 104b of FIG. 1 involve the doping of silicon substrate 100 to form each of wells 106a and 106b, followed by the fabrication of gate poly 112 situated over a thin layer 114 of $SiO_2$. The next step, shown in FIG. 2, of both the fabricating method disclosed in the aforesaid patent application and the method of the present invention comprises amorphizing, to the desired ultra-shallow depth of the extensions 118 being fabricated, those regions of the FIG. 1 MOSFETs being fabricated which include the upper polycrystalline silicon layer 200 of gate poly 112 and the upper crystalline silicon surface layers 202a, 202b, 204a and 204b of well 106 (which surface layers 202a, 202b, 204a and 204b are to be included in the source and drains 108a, 108b, 110a and 110b of the MOSFETs being fabricated). Amorphization may be achieved by ion implantation of a heavy atom, such as argon, silicon or germanium. However, germanium is to be preferred because it is a heavy atom which requires low doses to amorphize silicon, produces abrupt amorphous-crystalline interfaces, and is isoelectronic in the silicon lattice.

Figure 2:
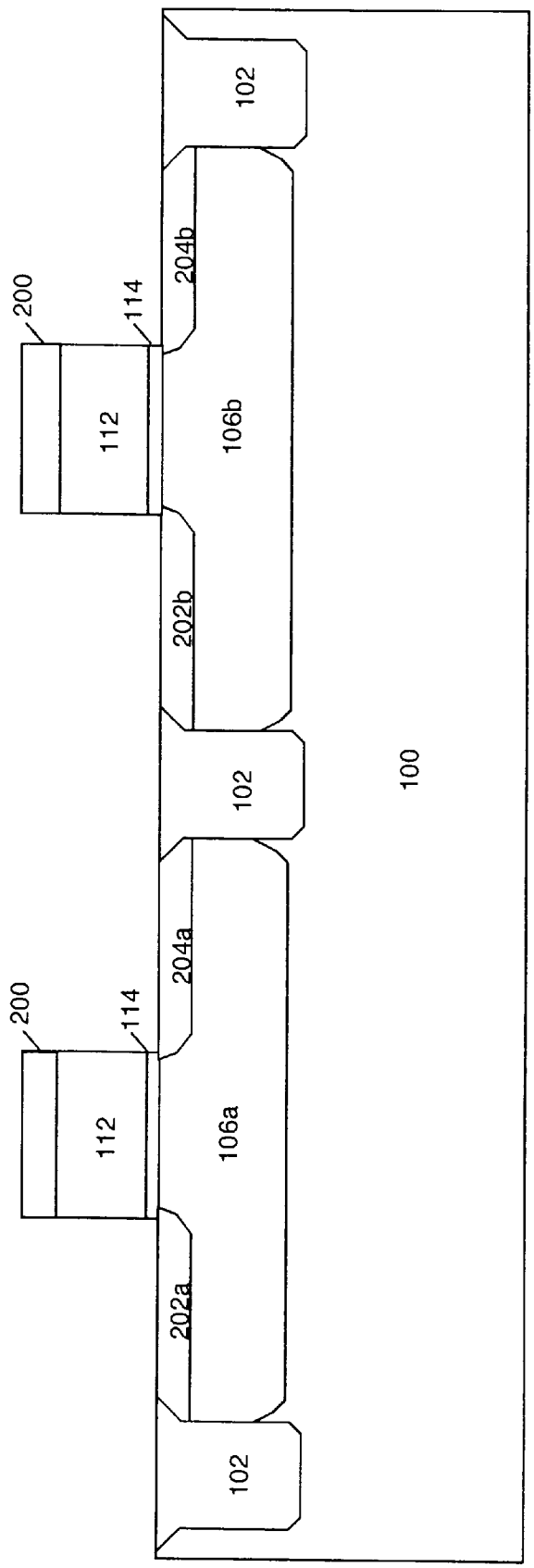
FIG. 2 diagrammatically shows the structure of the two FIG. 1 FETs that are to be fabricated in accordance with the method steps of the present invention at a fabrication stage which occurs just after (1) the fabrication of the FETs isolation elements, (2) the doping of the FETs wells, (3) the amorphization of the FETs silicon surface layers, and (4) the doping of the sources and drains of the FETs have been completed.

More particularly, as shown in FIG. 2, surface layers 202a, 202b, 204a and 204b on the side of gate poly 112, which are to be amorphized, extend all the way to an isolation element 102. Assuming, by way of example, that the desired ultra-shallow depth of these layers to be amorphized is substantially 30 nm (which is less than 80 nm), a dose of $2\times10^{14}$ atoms/$cm^2$ is required to achieve this desired 30 nm amorphization depth. A 20 KeV germanium implant at a dose of $2\times10^{14}$ atoms/$cm^2$ achieves this desired 30 nm amorphization depth of the layers 202 and 204. This implant condition is easily obtainable using existing high current implanters. However depending on the desired amorphous depth, the range of implant dose is between $1\times10^{13}$ atoms/$cm^2$ and $1\times10^{16}$ atoms/$cm^2$, while the range of implant energy is between 5 keV and 400 keV.

In the next step of the method of the present invention, amo rphized layers 202a and 204a have a $p^+$ dose of dopant (e.g., boron) ion implanted therein and layers 202*b* and 204*b* have an n+ dose of dopant (e.g., phosphorous or arsenic) ion implanted therein. A typical dosage for the lightly-dosed extensions is $5 \times 10^{14}$ atoms/cm². The implant energies for boron, phosphorous and arsenic typically are, respectively, 250, 2000 and 5000 electron volts. More generally, ion-implant dosages can range between $10^{13}$ to $10^{16}$ atoms/cm² and the implant energies can range between 10 and 100,000 electron volts.

Figure 2A:
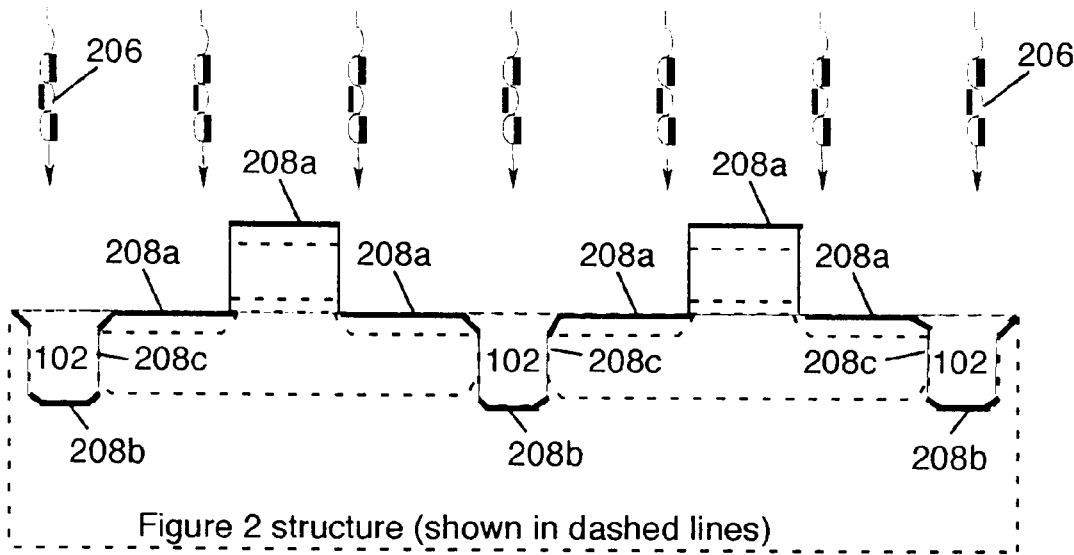
FIG. 2a will be used to describe the melt-threshold-shift heating problem which would occur if the surface of the structure of FIG. 2 were to be directly irradiated in accordance with the LTA process.

Referring now to FIG. 2*a*, there is shown the melt-threshold-shift heating problem which would occur if the surface of the structure of FIG. 2 were to be directly irradiated in accordance with the LTA process. In FIG. 2*a*, the FIG. 2 structure is shown in dashed lines. The entire top surface of this structure is flooded by substantially uniform high-power laser radiation 206. Applicant has employed a pulsed XeCl excimer laser operating at a wavelength of 308 nm for deriving radiation 206, although another type of excimer laser (e.g., a 193 nm ArF laser, a 248 nm KrF laser or a 351 nm XeF laser) could be used instead. While the fluence range for laser irradiation extends all the way from 0.05 Joules per cm² and 1.0 Joules per cm², the most likely radiation fluence sufficient to heat amorphized silicon to its melting temperature, but insufficient to heat crystalline silicon to its melting temperature, is 0.6 Joules per cm².

Figure 2B:
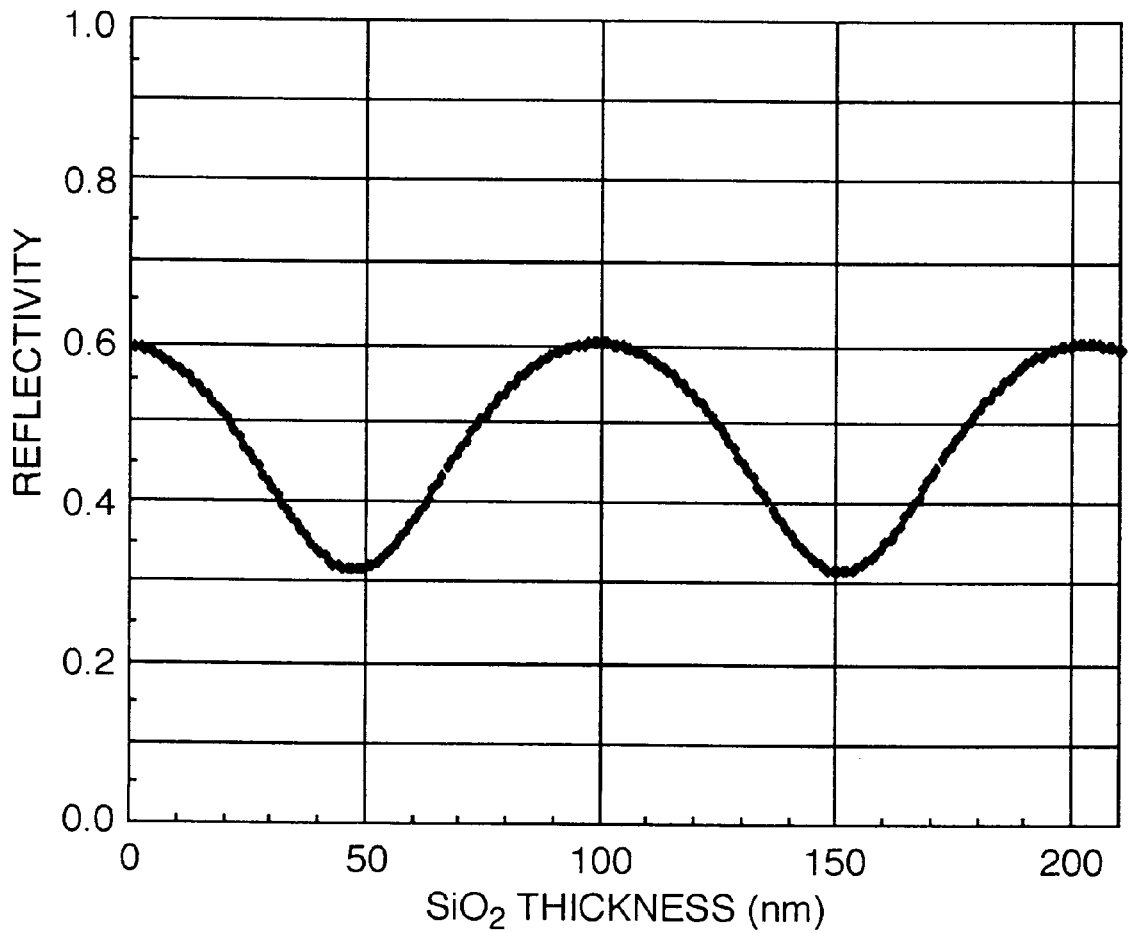
FIG. 2b illustrates the variability of the reflectivity of $SiO_2$ as a function of thickness compared to the constancy of the reflectivity of $SiO_2$ as a function of thickness.

It should be noted that isolation elements 102 are composed of $SiO_2$ which is substantially transparent to incident 308 nm radiation. Depending on the oxide thickness, the normally incident light is selectively absorbed in the silicon underlying the oxide isolation element or is reflected by the isolation element. This is graphically illustrated in FIG. 2*b* which shows the reflectivity of a silicon oxide layer sitting on top of silicon as a function of the oxide layer thickness. Light which is not reflected is absorbed in the underlying silicon. Since the reflectivity of uncoated silicon to incident 308 nm radiation is a constant 0.6, an oxide layer of the wrong thickness can almost double the absorption. In cases where the $SiO_2$ isolation elements 102 are of optimal thickness for absorption, the underlying silicon is highly heated by the high-power laser radiation 206 traveling therethrough and can be melted, resulting in undesirable changes to the isolation structure. The solid outline in FIG. 2*a* comprises (1) thick outline component 208*a* representing the relatively large amount of heat energy absorbed in the top surface of the silicon normal to directly incident high-power laser radiation 206, (2) thick outline component 208*b* representing the relatively large amount of heat energy absorbed in those surfaces of the silicon which are in contact with the bottom of the $SiO_2$ isolation elements 102 in response to heat energy transferred thereto from the isolation elements of optimal thickness for absorption, and (3) thin outline component 208*c* representing the relatively negligible amount of heat energy absorbed in those surfaces of the silicon which are approximately parallel to the incident radiation.

Although the silicon gate height and length are held to tight tolerances, large variations in the thickness of $SiO_2$ isolation elements 102 are common and to be expected. Hence, the heating of the silicon surface which is in contact with the bottom of the $SiO_2$ isolation elements 102 cannot be controlled. Extra heat in the isolation region can cause undesirable diffusion of the dopants in the wells and reduce the heat energy required to melt the amorphized regions of the source/drain and the gate. The degree of threshold lowering is dependent on the proximity of the source/drain regions and the $SiO_2$ isolation elements 102, and the thickness of the oxide isolation elements which determines the amount of incident 308 nm radiation absorbed in the silicon in contact with the $SiO_2$ isolation elements 102. This gives rise to the aforesaid melt-threshold-shift heating problem, in which device geometry and processing conditions strongly affect the amount of heat energy required to create the desired melt depth at the surface of the structure of FIG. 2.

Applicant's solution to the aforesaid melt-threshold-shift heating problem is to make the surface absorption of radiation uniform by covering the entire top surface of the structure shown in FIG. 2 with a deposited opaque layer of a material, such as most metals, metal oxides, metal nitrides, metal carbides, carbon, which is highly absorbent of all 308 nm radiation incident thereon and has a melting temperature which is higher than that of silicon. In the preferred embodiment of the present invention shown in FIG. 3, the opaque layer of material chosen comprises tantalum nitride because of its low reflectivity, high absorption and compatibility with silicon processing. Other desirable materials for the opaque layer are tungsten and tantalum. More specifically, in the preferred embodiment shown in FIG. 3, the top surface of $SiO_2$ isolation elements 102 and the top surface of amorphized silicon 200, 202*a*, 202*b*, 204*a* 204*b* are first covered with a relatively thin layer 310 (15 nm) of $SiO_2$ and then this thin layer of $SiO_2$ is covered with a relatively thick layer 312 (30 nm) of tantalum nitride. More generally, the thickness of the layer of $SiO_2$ may range between 5 nm and 50 nm and the thickness of the layer of tantalum nitride is preferably sufficient to absorb all 308 nm radiation incident thereon and may range between 20 nm and 150 nm. In general, the thickness of a deposited opaque layer of material should be at least sufficient to result in this material absorbing greater than 50% of all of the of selected-wavelength laser radiation incident thereon. In any event, the need for the layer of $SiO_2$ situated between the amorphized silicon and the layer of tantalum nitride arises to prevent the contamination of the silicon which would result if tantalum nitride were in direct contact with the silicon surface.

Figure 3A:
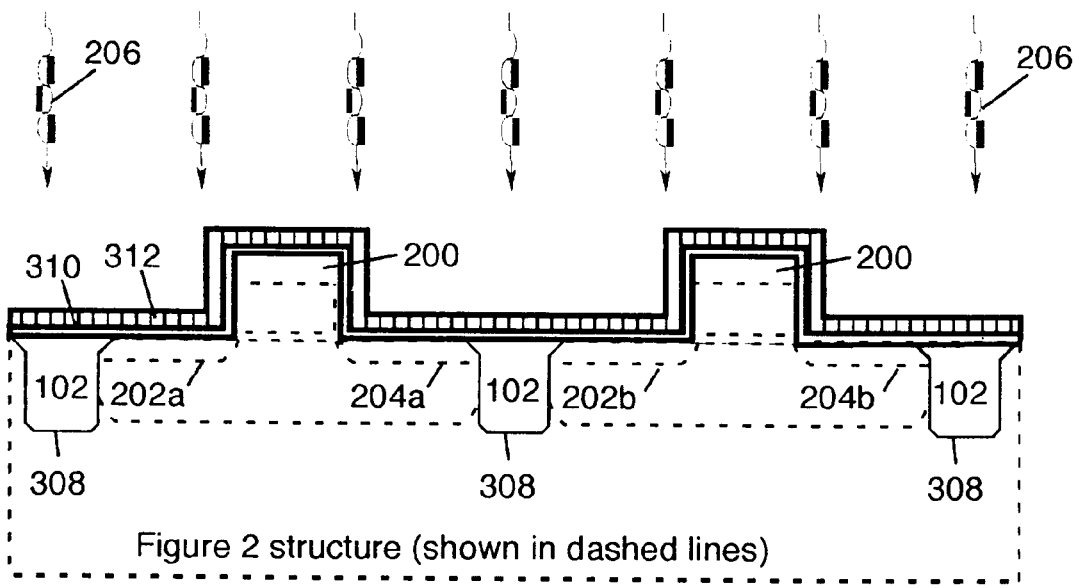
FIG. 3a will be used to describe the heating effect caused by the 20 surface of the structure of FIG. 3 being directly irradiated in accordance with the LTA process.

As is known, amorphous silicon has a factor of 10 lower thermal conductivity, a 300° C. lower melt temperature, and a 30 percent lower reflectivity than crystalline silicon. Referring to FIG. 3*a*, high-power laser radiation 206 incident on the top surface of the highly absorbent tantalum nitride layer 312 is sufficient to heat layer 312 to a relatively high temperature. The heat when conducted through the thin $SiO_2$ layer 310 to the top surface of the amorphized silicon 200, 202*a*, 202*b*, 204*a* 204*b*, is sufficient to melt the amorphized silicon 200, 202*a*, 202*b*, 204*a* 204*b*, but is insufficient to melt the crystalline silicon underlying the amorphized silicon, under the areas 202*a*, 202*b*, 204*a* and 204*b* in FIG. 3*a*.

$SiO_2$ is a relatively poor conductor of heat and does not absorb the incident radiation directly. Therefore, as indicated in FIG. 3*a* by thin solid line 308, the silicon in contact with the sides of isolation elements 102 is only negligibly heated as a result of the high-power laser radiation 206 incident on the top surface of tantalum nitride layer 312.

After the melted amorphized silicon layer is permitted to cool, thereby effecting a recrystallization of this layer, the tantalum nitride layer 312 is stripped.

Figure 3:
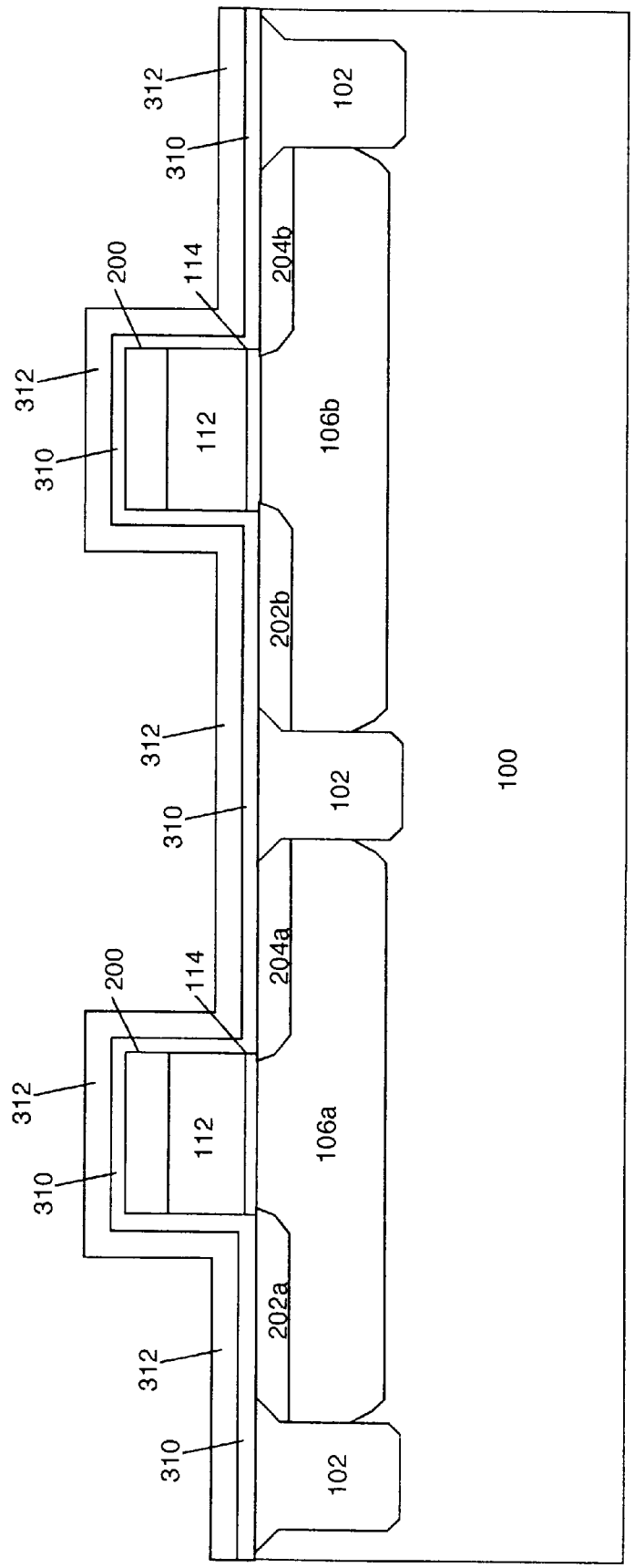
FIG. 3 diagrammatically shows the structure of the two FIG. 1 FETs that are to be fabricated in accordance with the method steps of the present invention at a later fabrication stage than that shown in FIG. 2.

The so-far described steps of the fabrication method of the present invention, which comprise the LTA process shown in FIGS. 3 and 3*a*, are employed for forming the ultra-shallow (preferably 30 nm depth) junctions of extensions 118. However, similar steps may be then used to fabricate the deep source and drain regions of the CMOS FET shown in FIG. 1. Specifically, following the fabrication of the ultra-shallow junctions of extensions 118, side wall spacers 116 are fabricated. Thereafter, each of the deep source and drain regions located between each side wall spacer 116 and an isolation element 102 is reamorphized to its desired depth deeper than the above-described original amorphization thereof. This may be accomplished with higher energy (e.g., 40 KeV) and higher dose (e.g., $6 \times 10^{14}$ atoms/cm$^2$) germanium implants. Following such reamorphization, additional dosage of dopants are added to the deep source and drain by ion implantation to preferably provide a total dosage of $1 \times 10^{15}$ atoms/cm$^2$. The implant energies for boron, phosphorous and arsenic remain, respectively, at 250, 2000 and 5000 electron volts, since the final fabricated deep source and deep junction depths are controlled solely by their amphorization depths. The amorphization step can be performed before or after the dopant implant step. The final steps for fabricating the deep source and deep junction comprise again employing the LTA process, which includes both depositing a tantalum nitride layer that has its top surface exposed to 308 nm radiation that is effective in melting only the amorphized silicon and thereafter stripping the tantalum nitride layer, to thereby form the source and drain junctions to a desired depth determined solely by the depth of the melted silicon of the fabricated CMOS FET. While the desired depth is preferably 120 nm, the range of desired depths is between 80 nm and 200 nm.

In the method of the preferred embodiment of the present invention described above, the fabrication of the deep source and drain involve the amorphization of the already-fabricated ultra-shallow (i.e., less than 150 nm depth) junctions, since these already-fabricated ultra-shallow junctions extend all the way to side wall spacers 116. However, it should be understood that the extent of the ultra-shallow junctions may be limited to solely the locations of the extensions and, therefore, not include the locations of the deep source and drain. In this case, the amorphization for the source and drain locations is independent of the amorphization for the extension locations, so that the amorphization for the source and drain locations may occur either before or after the amorphization for the extension locations. Furthermore, the present invention may be employed for fabricating only the extensions of an MOSFET or, alternatively, only the deep source and drain of an MOSFET, rather than both of these.

Generalizing, depositing an absorbing layer on the silicon wafer surface ensures equal absorption of laser radiation across the entire wafer surface. This eliminates the unpredictability which would occur if absorption of laser radiation in isolation elements were to take place. Further, the heat source is moved to the wafer surface and, hence, no thermal trapping due to heat absorption in the silicon adjacent the isolation elements occurs. Therefore, the present invention makes the LTA process practical in the fabrication on a selected area of a silicon wafer of a plurality of isolated, spaced, very-shallow-junction MOSFETs.

What is claimed is:

1. In a method for fabricating at least certain portions of source and drain junctions of each of a plurality of spaced MOSFETs in a selected area of a surface layer of a substrate, each one of said spaced MOSFETs including its own individually selected one of n and p channels, wherein said selected area includes an isolation element composed of a first selected material that is substantially transparent to selected-wavelength laser radiation disposed between crystalline silicon material of adjacent ones of said plurality of MOSFETs being fabricated, and wherein said method comprises the steps of:

(a) amorphizing a surface layer to a selected depth of said crystalline silicon material of said plurality of MOSFETs being fabricated;

(b) selectively ion implanting, in the amorphized silicon surface layer corresponding to each individual MOSFET of said of said plurality of spaced MOSFETs being fabricated, a selected dosage of dopants of the appropriate n or p species for that individual MOSFET;

(c) depositing at least a layer of a second selected material of a first selected thickness over the entire selected area of said surface layer of said substrate, said layer of said second selected material (1) being absorbent of selected-wavelength laser radiation incident thereon (2) having a melting temperature higher than that of crystalline silicon; and (d) then flooding the entire selected area of said surface of said layer of said second selected material with a selected value of substantially uniform energy laser radiation of said selected wavelength, said selected value being such as to result in the silicon underlying said selected area being heated to a temperature which is sufficient to melt amorphized silicon but insufficient to melt crystalline silicon;

whereby, after said melted silicon has cooled, it recrystallizes.

2. The method defined in claim 1, wherein step (c) comprises the step of:

(d) depositing a layer of a third selected material of a second selected thickness prior to the depositing of said second selected material, said third selected material exhibiting characteristics that prevent the amorphized silicon surface layer from being contaminated by direct contact with said second selected material.

3. The method defined in claim 2, wherein:

each of said first and third selected materials comprises SiO$_2$ and said second selected material comprises tantalum nitride.

4. The method defined in claim 3, wherein:

said selected wavelength of said laser radiation is 308 nm.

5. The method defined in claim 4, wherein:

said first thickness of said titanium nitride second selected material is in the range of 20 nm to 150 nm and said third thickness of said SiO$_2$ third selected material is in the range of 5 nm to 50 nm.

6. The method defined in claim 5, wherein:

said first thickness is substantially 30 nm and said third thickness is substantially 15 nm.

7. The method defined in claim 2, wherein:

each of said first and third selected materials comprises SiO$_2$ and said second selected material comprises a selected one of a metal, metal oxide, metal nitride, metal carbide, carbon, tungsten, or tantalum.

8. The method defined in claim 1, wherein:

said first selected thickness is sufficient to result in said second selected material absorbing greater than 50% of all of said of selected-wavelength laser radiation incident thereon.

9. The method defined in claim 1, wherein:

each of said MOSFETs includes a gate portion; and said certain portions of said source and drain junctions of a MOSFET comprise less than 150 nm depth extension portions of said source and drain junctions that are spatially located in contiguous relationship with the gate portion of that MOSFET.

10. The method defined in claim 9, wherein:

said certain portions of said source and drain junctions of a MOSFET 10 further comprise remaining portions having a depth in the range of 80 nm to 200 nm.

11. The method defined in claim 10, wherein:

said remaining portions of said source and drain junctions have a 15 depth of substantially 120 nm.

12. The method defined in claim 1, wherein:

said certain portions of said source and drain junctions of a MOSFET comprise particular portions of said source and drain junctions having a depth in the range of 80 nm to 200 nm.

13. The method defined in claim 12, wherein:

said particular portions of said source and drain junctions have a depth of substantially 120 nm.

14. The method defined in claim 3, wherein said method comprises the further step of:

(e) after said melted silicon has recrystallized, stripping said deposited layer of said second selected material.

15. The method defined in claim 1 wherein adjacent ones of said plurality of MOSFETs being fabricated comprise a pair of CMOS field-effect transistors.

* * * * *

UNITED STATES PATENT AND TRADEMARK OFFICE
CERTIFICATE OF CORRECTION

PATENT NO. : 5,956,603
DATED : September 21, 1999
INVENTOR(S) : Somit Talwar and Kurt Weiner It is certified that error appears in the above-identified patent and that said Letters Patent is hereby corrected as shown below:

Column 1,
Line 5, to be inserted after the title and before BACKGROUND OF THE INVENTION:

Government Rights
This invention was made with Government support under contract number N66001-95-C-8002 awarded by the Space and Naval Warfare Systems Command, San Diego. The Government has certain rights in the invention.

Signed and Sealed this

Sixteenth Day of October, 2001

Attest:

*Nicholas P. Godici*

NICHOLAS P. GODICI
*Attesting Officer*  *Acting Director of the United States Patent and Trademark Office*